(12) United States Patent
McCullough et al.

(10) Patent No.: US 6,248,505 B1
(45) Date of Patent: Jun. 19, 2001

(54) METHOD FOR PRODUCING A PREDETERMINED RESIST PATTERN

(75) Inventors: Christopher David McCullough, Leeds West Yorkshire; Kevin Barry Ray, Morley, both of (GB)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 0 days.

(21) Appl. No.: 09/267,859

(22) Filed: Mar. 12, 1999

(30) Foreign Application Priority Data

Mar. 13, 1998 (GB) .................................................. 9805320

(51) Int. Cl.⁷ .............................. G03F 7/30; G03F 7/021
(52) U.S. Cl. ...................... 430/326; 430/175; 430/176; 430/270.1; 430/945
(58) Field of Search .................................... 430/175, 176, 430/270.1, 271.1, 326, 945

(56) References Cited

U.S. PATENT DOCUMENTS

| 3,149,972 | 9/1964 | Herrick, Jr. et al. ...................... 96/75 |
| 3,628,953 | 12/1971 | Brinkman ............................. 430/270 |
| 3,778,270 | 12/1973 | Roos ........................................ 96/75 |
| 4,284,705 | 8/1981 | Philpot et al. ......................... 430/159 |
| 4,708,925 | 11/1987 | Newman ............................... 430/270 |
| 4,973,572 | 11/1990 | De Boer ................................ 503/227 |
| 5,372,915 | * 12/1994 | Haley et al. .......................... 430/302 |
| 5,466,557 | * 11/1995 | Haley et al. ....................... 430/278.1 |
| 5,491,046 | * 2/1996 | Deboer et al. ........................ 430/302 |
| 5,658,708 | 8/1997 | Kondo ............................... 430/288.1 |
| 5,705,308 | 1/1998 | West et al. ............................ 430/165 |
| 5,763,134 | * 6/1998 | Busman et al. ....................... 430/157 |
| 5,919,601 | * 7/1999 | Nguyen et al. .................... 430/278.1 |
| 6,042,987 | * 3/2000 | Kobayashi ......................... 430/270.1 |
| 6,074,802 | * 6/2000 | Murata et al. ..................... 430/270.1 |
| 6,152,036 | * 11/2000 | Verschueren et al. ............... 101/457 |
| 6,153,353 | * 11/2000 | Van Damme et al. ........... 430/270.1 |
| 6,165,689 | * 12/2000 | Vermeersch et al. ................. 430/302 |

FOREIGN PATENT DOCUMENTS

| 625 728 A2 | 11/1994 | (EP) . |
| 652 483 A1 | 5/1995 | (EP) . |
| 0823327 | 2/1998 | (EP) . |
| 1155035 | 6/1969 | (GB) . |
| 1 453 398 | 3/1974 | (GB) . |
| 0943847 | 2/1997 | (JP) . |
| 9620429 | 7/1996 | (WO) . |
| 9739894 | 10/1997 | (WO) . |

OTHER PUBLICATIONS

"The Chemical Behavior of Positive Working Systems" by J.S. Strieter. Eastman Kodak Company, Rochester, NY pp. 116–122.

* cited by examiner

Primary Examiner—John S. Chu
(74) Attorney, Agent, or Firm—Ratner & Prestia

(57) ABSTRACT

A method for producing a predetermined resist pattern on e.g. a lithographic printing plate, circuit board or mask, comprises the patternwise exposure to suitable radiation of a composition which comprises a novolac resin and a diazonium salt. The composition is rendered preferentially soluble to a developer in the regions which were exposed.

21 Claims, No Drawings

METHOD FOR PRODUCING A PREDETERMINED RESIST PATTERN

CLAIM TO PRIORITY

This application claims the benefit of UK application GB 9505320.0 filed Mar. 13, 1998.

FIELD OF THE INVENTION

The present invention relates to methods of forming a desired pattern on a support which has coated on it a coating comprising a positive working heat sensitive composition. The methods are suitable for making lithographic printing forms or fine resist patterns of electronic parts such as printed circuits, or masks carrying resist patterns. The invention further relates to novel compositions, novel imaged articles and novel precursors therefor.

BACKGROUND OF THE INVENTION

The art of lithographic printing is based on the immiscibility of ink, generally an oily formulation, and water, wherein in the traditional method the ink is preferentially retained by the image or pattern area and the water or fountain solution is preferentially retained by the non-image or non-pattern area. When a suitably prepared surface is moistened with water and an ink is then applied, the background or non-image area retains the water whilst the image area accepts ink and repels the water. The ink on the image area is then transferred to the surface of a material upon which the image is to be reproduced, such as paper, cloth and the like. Commonly the ink is transferred to an intermediate material called the blanket which in turn transfers the ink to the surface of the material upon which the image is to be reproduced.

New types of "waterless" lithographic printing employ only an oily ink material and preferentially ink-accepting image areas and ink-repelling non-image areas on the printing form.

A generally used type of lithographic printing form precursor (by which we mean a coated printing form prior to exposure and development) has a light sensitive coating applied to an aluminum base support. Negative working lithographic printing form precursors have a radiation sensitive coating which when imagewise exposed to radiation of a suitable wavelength hardens in the exposed areas. On development the non-exposed areas of the coated composition are removed leaving the image. On the other hand positive working lithographic printing form precursors have a radiation sensitive coating, which after imagewise exposure to radiation of a suitable wavelength becomes more soluble in the exposed areas than in the non-exposed areas, in a developer. In both cases only the image area on the printing form itself is ink-receptive.

The differentiation between image and non-image areas is made in the exposure process where a film is applied to the printing form precursor with a vacuum to ensure good contact. The printing form precursor is then exposed to a light source, comprising UV radiation. In the case where a positive form precursor is used, the area of the film that corresponds to the image in the printing form precursor is opaque so that no light will strike the printing form precursor, whereas the area on the film that corresponds to the non-image area is clear and permits the transmission of light to the coating which becomes more soluble and is removed.

The resists used in pattern forming methods for electronic parts such as printed circuits are also classified into two types: negative working and positive working. After exposure to radiation and development, the resist pattern is used as a mask for forming the patterns onto the underlying electronic elements - for example by etching an underlying copper foil. Due to the high resolution demands and the requirements of high resistance to etching techniques, positive working systems are widely used. In particular, in the main there have been used alkali developable positive working photoresists mainly composed of alkali-soluble novolac resins as disclosed in J.C. Streiter, Kodak Microelectronics Seminar Proceedings, 1979, p. 116. The primary active component of such positive working compositions, both in the context of lithographic printing forms and electronic parts, is a naphthoquinonediazide (NQD) derivative.

The types of electronic parts whose manufacture may use a photo resist include printed wiring boards (PWBs), thick- and thin-film circuits, comprising passive elements such as resistors, capacitors and inductors; multichip devices (MDCs); and integrated circuits (ICs). These are all classified as printed circuits.

A mask may be used in imaging methods, the required resist pattern being formed on the mask, which is then used as a screen in a later processing step.

Neuman, U.S. Pat. No. 4,708,925 (3M) describes a radiation sensitive element, e.g., a printing plate, having coated on it a composition stated to be photosolubilisable, comprising an alkali-soluble phenolic resin and an onium salt. The onium salt imparts developer resistance to the phenolic resin, this developer resistance being removed upon exposure to radiation, and consequent photolytic decomposition of the onium salt. Suitable onium salts are said to include iodonium, sulphonium, bromonium, chloronium, oxysulphonium, sulphoxonium, selenonium, telluronium, phosphonium and arsonium salt. Of these, iodonium, sulphonium and oxysulphonium are said to be preferred, especially iodonium. The maximum sensitivity of the composition is generally in the ultraviolet region but it is stated that the sensitivity can be adjusted by addition of one or more spectral sensitizers, of which many examples are listed.

EP-A-625 728 (Kodak) describes a radiation sensitive composition suitable for a printing plate, sensitive to both ultraviolet and infra-red radiation and capable of functioning in either a positive working or negative working manner, comprising (1) a resole resin, (2) a novolac resin, (3) a latent Bronsted acid and (4) an infra-red absorber. To utilize the printing plate as a positive-working plate requires that it be imagewise exposed to activating radiation, thereby rendering the exposed areas alkali-soluble. To utilize it as a negative working plate requires the steps of imagewise exposing to activating radiation, and heating the plate to provide reduced solubility in the unexposed regions. In achieving these properties the use of a mixture of a resole resin and a novolac resin is said to be essential.

Suitable latent Bronsted acids for use in the invention of EP-A-625 728 are said to include onium salts, in particular iodonium, sulfonium, phosphonium, selenonium, diazonium and arsonium salts. Use of diazonium salts is said to be preferred due to their equivalent sensitivity to other latent Bronsted acids in the infra-red region and higher sensitivity in the ultraviolet region.

SUMMARY OF THE INVENTION

We have now discovered advantageous methods, using compositions which contain diazonium salts.

In accordance with a first aspect of the present invention there is provided a method for producing a predetermined resist pattern on a support, the method comprising: the patternwise exposure of a precursor to heat, the precursor comprising the support with a coating thereon, the coating comprising a positive working composition; and the application of a developer to the patternwise-exposed coating; wherein the said composition comprises a novolac resin as the sole or major resin component, and a diazonium salt, wherein said composition has the property that it is preferentially developer soluble in regions which have been exposed. In this method the novolac resin suitably comprises more than 50%, and preferably at least 65%, of the total resin content of the composition, by weight, most suitably at least 85%.

In accordance with a second aspect of the invention there is provided a method for producing a predetermined resist pattern on a support, the method comprising: the patternwise exposure of a precursor to electromagnetic radiation, the precursor comprising the support with a coating thereon, the coating comprising a positive working composition; and the application of a developer to the patternwise-exposed coating; wherein the said composition comprises a novolac resin present in an amount of at least 85% of the total resin content of the composition, by weight, and a diazonium salt, wherein said composition has the property that it is preferentially developer soluble in regions which have been exposed. In relation to the second aspect of the invention, said electromagnetic radiation may bring about the required solubility change by being converted to heat, preferably assisted by a radiation absorbing compound within the coating, and/or may bring about the required solubility change by causing a photochemical reaction, for example by photolytically decomposing said diazonium salt.

In relation to the first and second aspects defined above the novolac resin preferably comprises 90–100% of the total resin content, by weight. Most preferably it is substantially the sole resin component.

In relation to the first and second aspects defined above, an additional resin component, when present, may for example be a resole resin, a styrene, for example 4-hydroxystyrene, 3-methyl-4-hydroxystyrene and 4-methoxystyrene, an acrylic acid for example methacrylic acid and acrylic acid, maleiimide, maleic acid and maleic acid anhydride, in each case, as homopolymers, co-polymers or terpolymers.

In relation to the first and second aspects defined above, preferably said composition prior to being exposed is significantly less soluble in a selected developer, than the corresponding composition in the absence of said diazonium salt; in practical terms the former may be regarded as an insoluble polymeric composition and the latter may be regarded as a soluble polymeric composition, in the selected developer.

The novolac resins useful in this invention are suitably condensation reaction products between appropriate phenols, for example phenol itself, C-alkyl substituted phenols (including cresols, xylenols, p-tert-butyl-phenol, p-phenylphenol and nonyl phenols), diphenols, e.g., bisphenol-A [2,2-bis(4-hydroxyphenyl)propane], and appropriate aldehydes, for example formaldehyde, chloral, acetaldehyde and furfuraldehyde. The type of catalyst and the molar ratio of the reactants used in the preparation of phenolic resins determines their molecular structure and therefore the physical properties of the resin. An aldehyde:phenol ratio between 0.5:1 and 1:1. preferably 0.5:1 to 0.8:1 and an acid catalyst is used to prepare those phenolic resins generally known as novolacs which are thermoplastic in character. Higher aldehyde:phenol ratios of more then 1:1 to 3:1. and a basic catalyst would give rise to a class of phenolic resins known as resoles, and these are characterized by their ability to be thermally hardened at elevated temperatures.

Diazonium salts have been extensively reviewed in *Light sensitive Systems*, J. Kosar, Wiley, New York, 1965, Chapter 7 and in *Photogaphic Chemistry*, Glafkides, Vol II, Fountain Press, London 1960. Further, patents illustrating suitable diazonium salts include U.S. Pat. No. 3,778,270, U.S. Pat. No. 3,149,972, GB 1,453,398 and U.S. Pat. No. 4,284,705, incorporated herein by reference.

Examples of suitable diazonium salts include the following: 2-methoxy-4-aminophenyl diazonium hexafluorophosphate; diphenylamine-4-diazonium hexafluorophosphate; diazo resin hexafluorophosphate; 4-aminodiphenylamine diazonium sulfate; 4-aminodiphenylamine diazonium chloride; 4-piperidino aniline diazonium sulfate; and 4-diethylamino aniline diazonium sulfate.

The diazonium salts are usually sensitive to ambient ultraviolet radiation and so safelight handling conditions are preferably employed for the methods of the present invention.

Suitably the diazonium salt is present in an amount of from 1 to 25%, preferably 1.5 to 15%, most preferably 2 to 8%, by weight, on the total weight of the composition when dried.

DETAILED DESCRIPTION OF THE INVENTION

We will now describe the formation of a desired pattern on a support, by means of methods as defined above. The support could, for example, be a coated lithographic printing form precursor, or a coated electronic part precursor, or a coated mask precursor.

In certain embodiments of the invention heat may be patternwise delivered conductively to the precursor, by direct application. For example the composition may be contacted by a heat stylus; or the reverse face of the support onto which the composition has been coated may be contacted by a heat stylus.

In other embodiments of the invention electromagnetic radiation is used to expose the composition, the radiation bringing about a photochemical reaction in the coating (second aspect of the invention) and/or generating heat (first or second aspect of the invention) in the latter case the coating containing a radiation absorbing compound which absorbs the radiation and converts it to heat. Preferably the wavelength of the radiation entirely or predominantly exceeds 500 nm. Preferably, it is entirely or predominantly in the range 600 to 1400 nm, more preferably 700 to 1200 nm. The electromagnetic radiation is preferably infra-red or visible radiation. Infra-red radiation is preferred, preferably delivered by a laser.

Examples of lasers which can be used in the method of the present invention include semiconductor diode lasers emitting at between 600 nm and 1200 nm. An example is the Nd YAG laser which emits at 1064 nm, but any laser of sufficient imaging power and whose radiation is absorbed by the composition, can be used.

In such compositions intended to be iradiated, especially those compositions intended for the method of the first aspect of the invention, a suitable radiation absorbing compound may usefully be a pigment. Suitable pigments include carbon black or graphite, or a commercially available color pigment such as Heliogen Green as supplied by BASF, or Nigrosine Base NG1 as supplied by NH Laboratories Inc, or Milori Blue (C.I. Pigment Blue 27) as supplied by Aldrich.

Alternatively or additionally a suitable radiation absorbing compound may be an infrared absorbing dye, especially for those compositions intended for the method of the second aspect of the invention.

Preferably the infra-red absorbing compound is one whose absorption spectrum is significant at the wavelength output of the radiation source, preferably a laser, which is to be used in the method of the present invention. This is particularly important when the infra-red absorbing compound is a dye, whose absorption band is narrow. Usefully it may be an organic pigment or dye such as phthalocyanine. Alternatively it may be a dye of the squarylium, merocyanine, cyanine, indolizine, pyrylium or metal dithioline classes.

In compositions intended to require visible radiation for imagewise exposure the compositions may suitably contain a pigment, or a visible sensitive dye, "tuned" to absorb visible light, and convert it to heat.

Pigments are generally insoluble in the compositions and so comprise particles therein. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they do not have any marked effect on the solubility of the unheated composition, in the developer. In contrast dyes are generally soluble in the compositions. Generally they are narrow band absorbers, typically able efficiently to absorb electromagnetic radiation and convert it to heat only over a range of wavelengths not exceeding 100 nm, and so have to be selected having regard to the wavelength of the radiation which is to be used for imaging. Generally they are decomposed by the radiation. Frequently they have a marked effect on the solubility of the unheated composition in the developer, typically making it much less soluble.

Significant advantages of pigments over dyes are that they may be used over a wider range of wavelengths and they are cheaper and more readily available.

Suitably the radiation absorbing compound, when present, constitutes at least 1%, preferably at least 2%, preferably up to 20%, more preferably up to 15%, by weight, on the total weight of the composition. Thus a preferred weight range for the radiation absorbing compound may be expressed as 2–15% by weight, on the total weight of the composition. There may be more than one radiation absorbing compound. References herein to the proportion of such compound(s) are to their total content.

The compositions of the invention may contain other ingredients such as stabilizing additives and inert colorants.

In one preferred embodiment of the invention an additional layer comprising a radiation absorbing compound can be used. This multiple layer construction can provide routes to high sensitivity as larger quantities of absorber can be used without affecting the function of the image forming layer. In principle any radiation absorbing material which absorbs sufficiently strongly in the desired band can be incorporated or fabricated in a uniform coating. Dyes, metals and pigments (including metal oxides) may be used in the form of vapor deposited layers. Techniques for the formation and use of such films are well known in the art, for example as described in EP 0,652,483.

The preferred supports in the present invention in the context of lithography are those that are hydrophilic as the uniform coating or which can be treated to provide a hydrophilic surface, for example by use of a hydrophilic layer. However the invention is also applicable to waterless lithography, in which the support may be oleophilic and the coating oleophobic.

The support may be a semiconductor or conductor in the context of electronic circuitry. In the context of lithography it may be an aluminum plate which has undergone the usual anodic, graining and post-anodic treatments well known in the lithographic art for enabling a radiation sensitive composition to be coated thereon and for the surface of the support to function as a printing background. Another base material which may be used in the present invention in the context of lithography is a plastics material base or a treated paper base as used in the photographic industry. A particularly useful plastics material base is polyethylene terephthalate which has been subbed to render its surface hydrophilic. Also a so-called coated paper which has been corona discharge treated can be used.

In the specification when we state that a composition is developer soluble we mean that it is soluble in a developer, to an extent useful in a resist development process. When we state that a composition is developer insoluble we mean that it is not soluble in a developer, to an extent useful in a resist development process.

The composition is preferably used as a coating on a lithographic printing form, an electronic circuit form or a mask.

In the method of the present invention a positive working lithographic printing form, electronic part or mask is obtained after patternwise exposure and processing of a precursor. On patternwise exposure the exposed areas of the composition are rendered more soluble in the developer. The developer solubility of the coated composition is preferably such that there is no significant coating loss in the unexposed areas on development of the exposed areas. Therefore on imagewise exposure there is a change in the solubility differential of the unexposed composition and of the exposed composition. Thus in the exposed areas the composition is dissolved, to form the pattern.

The coated printing form, electronic circuit or mask precursors of the invention may be heat imaged indirectly by exposure to a short duration of high intensity radiation transmitted or reflected from the background areas of a graphic original located in contact with the recording material.

In another aspect of the invention, applicable to the first and second aspects defined above, the coated printing form, electronic circuit or mask precursor may be patternwise heated using a heated body, as described above.

In another aspect of the invention the coated printing form, electronic circuit or mask precursors may be exposed by means of suitable radiation, as defined above, to heat the coating patternwise, and/or to bring about the required photochemical change, in the second aspect defined above.

The developer is dependent on the nature of the components of the composition, but is preferably an aqueous composition. Common components of aqueous developers are surfactants, chelating agents such as salts or ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer containing inorganic or organic metasilicates when the polymeric substance, as is preferred, is a phenolic resin.

In accordance with a further aspect of the present invention there is provided an imaged article, for example a printing form, electronic part or mask, having a pattern formed in the said coating thereof by means of the methods of the present invention.

Certain compositions for use in the method of the present invention are believed to be novel and constitute a further aspect of the present invention. Such compositions are those described above, in which the novolac resin is the sole resin component or provides at least 85% by weight, preferably 90–100%, of the total resin content. Likewise, precursors carrying a coating comprising such novel composition are themselves novel and constitute further aspects of the present invention.

Any feature of any aspect of the present invention or embodiment described herein may be combined with any feature of any other aspect of the invention or embodiment described herein.

The following Examples more particularly serve to illustrate the various aspects of the present invention described hereinabove.

EXAMPLES

The invention will now be described, by way of illustration, with reference to the examples which follow. Examples prefixed with the letter C are comparative examples not in accordance with the invention.

Starting materials

The following materials are referred to hereinafter:

Resin A: LB 6564—a 1:1 phenol/cresol novolac resin marketed by Bakelite, UK.
Resin B: LB744—a cresol novolac resin marketed by Bakelite, UK.
Carbon black FW2—a channel type carbon black obtained from Degussa, Macclesfield, UK.
Prussian blue (ferric ferrocyanide, CI Pigment Blue 27) as supplied by Aldrich Chemical Company, Dorset, UK.
Onium Compound A—Diazo LDN-1 $PF_6$ (Diphenylamine-4-diazonium resin hexafluorophosphate), as supplied by Varichem Co. Ltd. of Brynmawr, Wales.
Onium compound B—Diazo LDN-2 $PF_6$ (diazo resin hexafluorophosphate), as supplied by Varichem Co. Ltd. of Brynmawr, Wales.
Dye A - KF654B PINA as supplied by Riedel de Haan UK, Middlesex, UK, believed to have the structure:

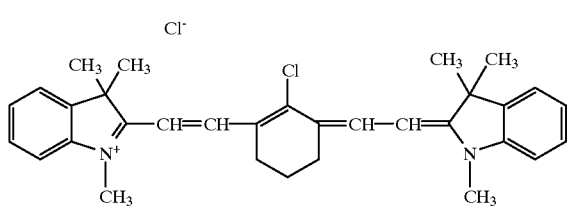

Dye B—Crystal violet (Basic violet3, C.I. 42555, Gentian Blue) as supplied by Aldrich Chemical Company of Dorset, UK.
Developer A—14% sodium metasilicate pentahydrate in water.
Developer B—7% sodium metasilicate in water.

Exposure test Methods
Imaging using Rotatable Disc Apparatus:

For some examples the coated support to be imaged was cut into a circle of 105 mm diameter and placed on a disc that could be rotated at a constant speed of 2500 revolutions per minute. Adjacent to the spinning disc a translating table held the source of the laser beam so that the laser beam impinged perpendicularly to the coated support, while the translating table moved the laser beam radially in a linear fashion with respect to the spinning disc. The exposed image was in the form of a spiral whereby the image in the center of the spiral represented slow laser scanning speed and long exposure time and the outer edge of the spiral represented fast scanning speed and short exposure time.

The laser used was a single mode 830 nm wavelength 200 mW laser which was focused to a spot of approximately 10 micron diameter. The laser power supply was a stabilized constant power source.

Imaging using Creo Trendsetter 3244:

A commercially available image setter, using Procomm Plus Software, operating at a wavelength of 830 nm at powers of up to 8 W and supplied by Creo Products Inc. of Burnaby, Canada was used for some examples, to yield more accurate sensitivity results.

Direct Heat Imaging

For some examples some of the plates were subjected to heat delivered from a Weller soldering iron EC 2100 M heated to 311° C. The speed of movement of the soldering iron over the plate surface was 1 $cms^{-1}$ in every case. The soldering face was applied to the coated face of the plates, for these examples.

Examples C1–C4 and 1–4

The coating formulations for examples C1–C4 and 1–4 were ball milled together for 24 hours in 2-methoxypropan-2-ol/dimethylformamide 50:50 (v:v). The support used was a 0.3 mm sheet of aluminum that had been electrograined and anodized and post anodically treated with an aqueous solution of an inorganic phosphate. The coating solutions were coated onto the support by means of a wire wound bar. The solution concentrations were selected to provide the specified dry film compositions with a coating weight of 2.5 $gm^{-2}$ after thorough drying at 100° C. (Examples C1–C3) or 130° C. (Examples C4 and 1–4) for 3 minutes in a Mathis labdryer oven as supplied by Werner Mathis AG, Germany.

| | Example | | | | | | | |
|---|---|---|---|---|---|---|---|---|
| | C1 | C2 | C3 | C4 | 1 | 2 | 3 | 4 |
| Component | Parts by Weight | | | | | | | |
| Resin A | 88 | | 88 | | | | | |
| Resin B | | 88 | | 88 | 85 | 82 | 85 | 82 |
| FW2 | 12 | 12 | | | | | | |
| Prussian Blue | | | 12 | 12 | 12 | 12 | 12 | 12 |
| Onium Compound A | | | | | 3 | 6 | | |
| Onium Compound B | | | | | | | 3 | 6 |

The plates were then imaged on the rotatable disc apparatus as described above. The exposed plates were then processed by immersing in an aqueous developer solution at 20° C. for 60 seconds using an appropriate aqueous developer solution as described in the table below. Plate sensitivities were then determined.

| Example | Developer | Sensitivity | Remarks |
|---|---|---|---|
| C1 | B | — | All coating dissolves away |
| C2 | A | 110 mJcm$^{-2}$ | Image attack seen as speckles |
| C3 | A | — | All coating dissolves away |
| C4 | A | 105 mJcm$^{-2}$ | |
| 1 | A | 76 mJcm$^{-2}$ | Image attack seen as speckles |
| 2 | A | 76 mJcm$^{-2}$ | |
| 3 | A | 76 mJcm$^{-2}$ | |
| 4 | A | 80 mJcm$^{-2}$ | |

Examples 5–10

The coating formulations for examples 5–10 were prepared as described in examples 1–4 as solutions in 2-methoxypropan-2-ol/dimethylformamide 90:10 (v:v). The formulations were coated as previously described to provide the specified dry film composition with a coating film weight of 2.5 gm$^{-2}$ after thorough drying at 130° C. for 3 minutes in a Mathis labdryer oven.

| | Example | | | | | |
|---|---|---|---|---|---|---|
| | 5 | 6 | 7 | 8 | 9 | 10 |
| Component | Parts by Weight | | | | | |
| Resin A | 90 | 80 | 70 | 60 | 50 | 40 |
| Resin B | | 10 | 20 | 30 | 40 | 50 |
| Dye A | 2 | 2 | 2 | 2 | 2 | 2 |
| Onium Compound A | 6 | 6 | 6 | 6 | 6 | 6 |
| Dye B | 2 | 2 | 2 | 2 | 2 | 2 |

The plates were then imaged on the Creo Trendsetter at 8 watts with a 0 to 100% screen image at an imagining energy density of 240 mJcm$^{-2}$. The exposed plates were then developed using a Horsell Mercury Mark V plate processor containing developer A at 22° C. The processing speed was set at 1000 mm min$^{-1}$. Finally, images produced were evaluated visually and measured using a Tobias plate check densitometer.

| Example | Resolution Range at 240 mJcm$^{-2}$ |
|---|---|
| 5 | Coating washes away |
| 6 | Coating washes away |
| 7 | 30% to 87.5% |
| 8 | 3% to 87.5% |
| 9 | 3% to 60% |
| 10 | 3% to 50% |

In reviewing all of the examples described above it should not be assumed that an example which does not show a good result denotes an unusable composition. The test conditions selected are likely to be suitable for some compositions and not for others; they are not optimized for each composition.

In the specification we refer in various places to UV, infra-red and visible radiation. A person skilled in the art will be aware of the typical wavelength ranges of these radiations, and that there may be an overlap at the margins between definitions of these terms, and also that many sources emit a distribution of wavelengths. However, UV radiation typically has a wavelength range not exceeding about 450 nm. Visible radiation has a wavelength range typically of about 400 to 700 nm. Infra-red radiation typically has a wavelength range in excess of 600 nm, the boundaries between ultraviolet and visible radiation, and between infra-red radiation and visible radiation, not being sharp ones. When we state in this specification that radiation is, for example, "predominantly" infra-red radiation we mean that whilst there may be non-infra-red components in the wavelength distribution these are not significant, in the method.

Having described the invention, we now claim the invention and its equivalents.

What is claimed is:

1. A method for producing a predetermined resist pattern on a support, the method comprising:
   (a) patternwise exposing a precursor to heat, the precursor comprising a coating on the support, and producing exposed regions in the coating; and
   (b) applying a developer to the coating and preferentially removing the exposed regions; in which the coating consists essentially of:
      (i) a novolac resin;
      (ii) optionally, an additional resin component;
      (iii) a diazonium salt;
      (iv) optionally, a radiation adsorbing compound that absorbs radiation and converts it to heat; and
      (v) optionally, one or more components selected from the group consisting of stabilizing additives and inert colorants; wherein said novolac resin is present in an amount of at least 85 wt % of the total resin content.

2. The method of claim 1 wherein said novolac resin is the sole resin component of said coating.

3. The method of claim 1 in which step (a) is carried out by direct delivery of heat patternwise by a heated body to the precursor.

4. The method of claim 1 wherein the precursor is an article precursor and an imaged article is produced.

5. The method of claim 1 wherein the precursor is a printing form precursor and a printing form precursor is produced.

6. The method of claim 1 wherein the precursor is an electronic part precursor and an electronic part is produced.

7. The method of claim 1 wherein the precursor is a mask precursor and a mask is produced.

8. A method for producing a predetermined resist pattern on a support, the method comprising:
   (a) patternwise exposing a precursor to electromagnetic radiation, the precursor comprising a coating on the support, and producing exposed regions in the coating; and
   (b) applying a developer to the coating and preferentially removing the exposed regions;
   in which the coating consists essentially of:
      (i) a novolac resin, the novolac resin comprising at least 85 wt % of the resin content of the coating;
      (ii) optionally, an additional resin component;
      (iii) a diazonium salt;
      (iv) optionally, a radiation adsorbing compound that absorbs radiation and converts it to heat; and
      (v) optionally, one or more components selected from the group consisting of stabilizing additives and inert colorants.

9. The method of claim 8 wherein said electromagnetic radiation predominantly exceeds 500 nm.

10. The method of claim 8 wherein said electromagnetic radiation is predominantly 600 to 1400 mn.

11. The method of claim 8 wherein said electromagnetic radiation is delivered by a laser.

12. The method of claim 8 wherein said precursor comprises a radiation absorbing compound that absorbs radiation and converts it to heat.

13. The method of claim 12 wherein said coating comprises said radiation absorbing compound.

14. The method of claim 12 wherein said precursor comprises an additional layer disposed between said coating and said support, and wherein said additional layer comprises said radiation absorbing compound.

15. The method of claim 12 wherein said radiation absorbing compound is a radiation absorbing dye.

16. The method of claim 12 wherein said radiation absorbing compound is a radiation absorbing pigment.

17. The method of claim 8 wherein said novolac resin is the sole resin component of said coating.

18. The method of claim 8 wherein the precursor is an article precursor and an imaged article is produced.

19. The method of claim 8 wherein the precursor is a printing form precursor and a printing form precursor is produced.

20. The method of claim 8 wherein the precursor is an electronic part precursor and an electronic part is produced.

21. The method of claim 8 wherein the precursor is a mask precursor and a mask is produced.

* * * * *

UNITED STATES PATENT AND TRADEMARK OFFICE
CERTIFICATE OF CORRECTION

PATENT NO. : 6,248,505 B1
DATED : June 19, 2001
INVENTOR(S) : McCullough et al.

It is certified that error appears in the above-identified patent and that said Letters Patent is hereby corrected as shown below:

Column 8,
Line 29, delete "$cms^{31\ 1}$" and insert therefor -- $cms^{-1}$ --.

Column 10,
Line 26, delete "adsorbing" and insert therefor -- absorbing --.
Line 40, delete the second occurrence of "precursor"
Line 59, delete "adsorbing" and insert therefor -- absorbing --

Column 12,
Line 6, delete the second occurrence of "precursor"

Signed and Sealed this

Twenty-seventh Day of November, 2001

Attest:

NICHOLAS P. GODICI
*Attesting Officer*   *Acting Director of the United States Patent and Trademark Office*